US007806167B2

(12) United States Patent
Wu et al.

(10) Patent No.: US 7,806,167 B2

(45) Date of Patent: Oct. 5, 2010

(54) HEAT DISSIPATION DEVICE

(75) Inventors: Wei-Le Wu, Shenzhen (CN); Chun-Chi Chen, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 719 days.

(21) Appl. No.: 11/767,014

(22) Filed: Jun. 22, 2007

(65) Prior Publication Data

US 2008/0314555 A1 Dec. 25, 2008

(51) Int. Cl.
*H05K 7/20* (2006.01)

(52) U.S. Cl. ................. 165/80.3; 165/104.33; 361/697; 361/700

(58) Field of Classification Search ................ 165/80.3, 165/104.33, 121; 361/697, 700
See application file for complete search history.

(56) References Cited

U.S. PATENT DOCUMENTS 6,031,720 A * 2/2000 Crane et al. ................. 361/695
7,019,969 B2 3/2006 Foster, Sr. et al.
7,038,911 B2 * 5/2006 Foster et al. ................ 361/695
7,283,364 B2 * 10/2007 Refai-Ahmed et al. ...... 361/719
7,636,240 B2 * 12/2009 Kim .......................... 361/700
2003/0141041 A1 * 7/2003 Chen ......................... 165/80.3
2005/0087329 A1 * 4/2005 Zhang et al. ........... 165/104.33
2005/0139347 A1 * 6/2005 Chen et al. ............. 165/104.33
2006/0028798 A1 * 2/2006 Wang ......................... 361/697
2007/0044942 A1 * 3/2007 Mou ..................... 165/104.33
2007/0119566 A1 * 5/2007 Peng ......................... 165/80.3
2007/0295487 A1 * 12/2007 Xia et al. ............... 165/104.33

FOREIGN PATENT DOCUMENTS

TW 526950 4/2003
TW M242770 9/2004

* cited by examiner

*Primary Examiner*—Allen J Flanigan
(74) *Attorney, Agent, or Firm*—Jeffrey T. Knapp

(57) ABSTRACT

A heat dissipation device includes a base, a first fin group located above the base, at least one heat pipe connecting the base and the first fin group and first and second fans located at two opposite sides of the first fin group. Each of the first and second fans is oriented with an acute angle to the base. Outlet and inlet of the first and second fans are oriented towards the base and the first fan produces cooling air to blow towards the first fin group and the base and the second fan draws heated air away from the first fin group and the base.

16 Claims, 8 Drawing Sheets

20
30
22
320
322
40
50
30
40a
51a
60
42a
50a
53a

HEAT DISSIPATION DEVICE

BACKGROUND OF THE INVENTION

1. Field of the Invention

The present invention relates to a heat dissipation device, and more particularly to a heat dissipation device which can more effectively use an airflow generated by fans thereof to dissipate heat on a base of the device which is used for contacting with an electronic component.

2. Description of Related Art

As computer technology continues to advance, electronic components such as central processing units (CPUs) of computers are being made to provide faster operational speeds and greater functional capabilities. When a CPU operates at high speed in a computer enclosure, its temperature can increase greatly. It is desirable to dissipate the heat quickly, for example by using a heat dissipation device attached to the CPU in the enclosure. This allows the CPU and other electronic components in the enclosure to function within their normal operating temperature ranges, thereby assuring the quality of data management, storage and transfer.

A related heat dissipation device shown in FIG. 1, comprises a base 100, a fin group 120 disposed above the base 100, a plurality of heat pipes 130 connecting the base 100 and the fin group 120 and two axial flow fans 110 arranged on two opposite lateral side of the fin group 120. The fin group 120 comprises a plurality of fins (not labeled) spaced parallel to the base 100. A plurality of channels (not labeled) are defined between the fins. The fans 110 force airflow to pass through the channels defined by the fins, whereby heat of the fins from the heat pipes 130 and the base 100 can be dissipated to atmosphere.

As the CPU and other electronic components generate more heat, heat transmitted to the base 100 by the CPU and other electronic components is greater which needs to be dissipated in real time. However, by the provision of the fans 110 being disposed perpendicular to the base, the airflow forced by the fans 110 directly flows toward the fin group 120 and fails to flow downward and toward the base 100 for dissipation of heat thereon. Heat dissipation of the base 100 only depends on the heat pipes 130 transferring the heat of the base 100 to the fin group 120.

Therefore, it is desirable to provide a heat dissipation device that eliminates the aforementioned problems.

SUMMARY OF THE INVENTION

A heat dissipation device in accordance with a preferred embodiment of the present invention includes a base, a first fin group located above the base, at least one heat pipe connecting the base and the first fin group and first and second fans located at two opposite sides of the first fin group. Each of the first and second fans faces inclinedly downwardly toward the base. An airflow generated by the first fan flows from the first fan towards the first fin group and the base, and an airflow generated by the second fan flows from the base and the first fan group toward the second fan. Accordingly, heat on the base from a heat-generating electronic component on which the base is mounted can be dissipated in real time.

Other advantages and novel features will become more apparent from the following detailed description of preferred embodiments when taken in conjunction with the accompanying drawings, in which:

BRIEF DESCRIPTION OF THE DRAWINGS

Many aspects of the present apparatus and method can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION OF THE INVENTION

Figure 1:
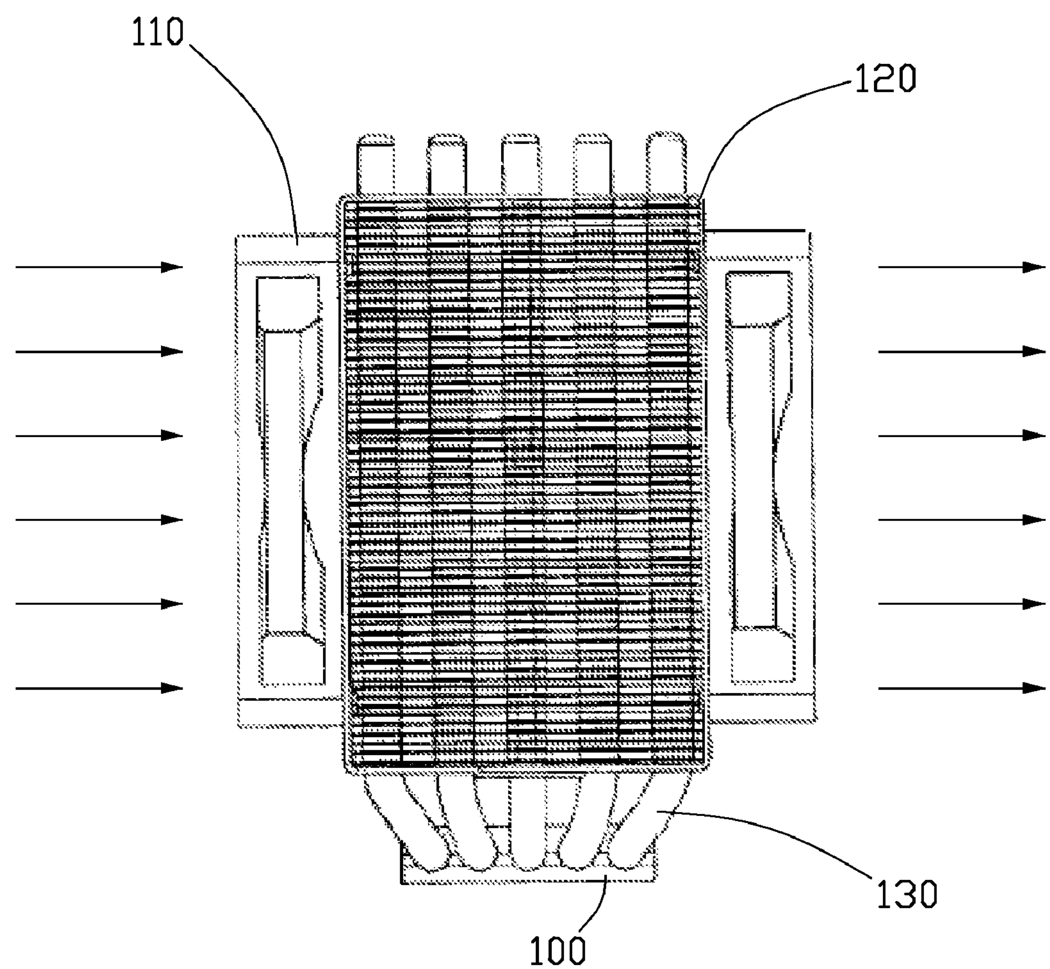
FIG. 1 is an assembled view of a heat dissipation device in accordance with related art.
Figure 2:
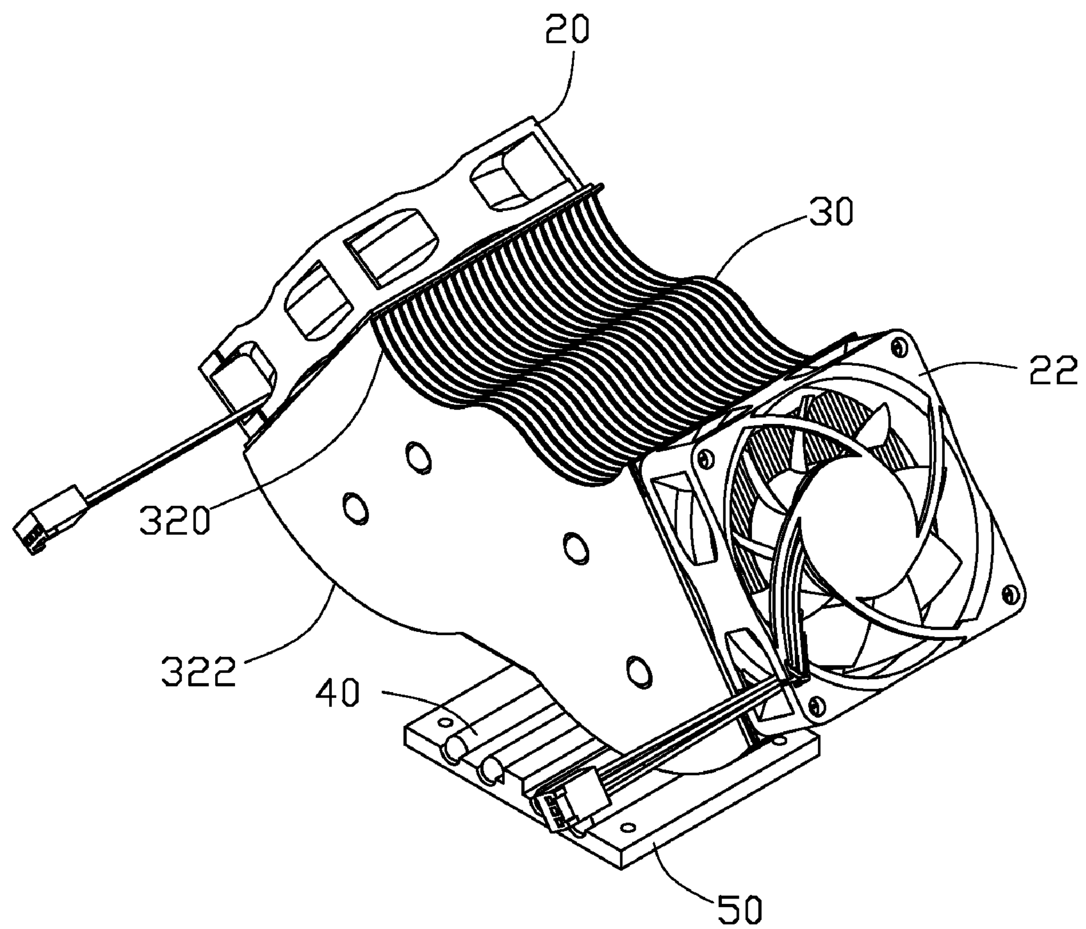
FIG. 2 is an assembled view of a heat dissipation device in accordance with a first embodiment of the present invention.

Referring to FIGS. 2-5, a heat dissipation device in accordance with a first embodiment of the present invention is illustrated. The heat dissipation device, which is used to cool down a heat-generating electronic component (not shown) such as a central processing unit (CPU) mounted on a printed circuit board (not shown), comprises a base 50, a first fin group 30 disposed above the base 50, two pairs of heat pipes 40 connecting the base 50 and the first fin group 30 and first and second fans 20, 22 located at two opposite lateral sides of the first fin group 30.

The base 50 is substantially rectangular, and made of thermal conductive material such as copper or aluminum. The base 50 has a top surface 51 and a bulge 52 extending downwardly from a bottom surface opposing the top surface 51 of the base 50 and having a lower face 521 adapted for attachment to the heat-generating electronic component (not shown). A rib 54 with a rectangular section is formed from a middle portion of the top surface 51 of the base 50. Two pairs of parallel grooves 53 with a semicircular section are defined in the top surface 51 of the base 50 and in two opposite lateral sides of the rib 54. Four mounting holes 55 are defined in four corners of the top surface 51 of the base 50, for engaging with a fixture (not shown) securing the heat dissipation device to the printed circuit board.

The first fin group 30 comprises a plurality of fins 32 spaced parallel to each other and perpendicular to the base 50. A plurality of channels (not labeled) are defined between the fins 32. Each fin 32 comprises a first side edge 320 at an upper portion thereof and a second side edge 322 at a lower portion thereof opposite to the first side edge 320. A pair of first and second lateral sides 321, 323 are located between the first and second side edges 320, 322 and each are oriented inclinedly relative to an orientation of the base 50. Each of the lateral side 321, 323 are inclined outwardly away from the base 50 along a top-to-down direction. The first side edge 320 has a waved-shaped figuration and has two troughs and a crest between the two troughs. The second side edge 322 has a length longer than that of the first side edge 320 and two arc-shaped side edges and a straight side edge recessed between the two arc-shaped side edges. A first flange 324 extends horizontal from the straight side edge of the second side edge 322 and parallel to the base 50. A pair of second and third flanges 325, 327 extend perpendicularly from two opposite end portions of the first and second lateral sides 321, 323, respectively. The first, second and third flanges 324, 325 and 327 of the fins 32 each comprise latching portions (not shown) that can engage with each other for assembling the fins 32 together to form the first fin group 30. Each fin 32 further defines four round through holes 326 adjacent to the first and second lateral sides 321, 323. The four through holes 326 are symmetrically distributed at two opposite sides of the first flange 324 and each has an annular collar 328 extending perpendicularly from the fin 32 around the through hole 326. All the through holes 326 cooperate with each other to form passageways for accommodating the heat pipes 40. All the first and second lateral sides 321, 323 form first and second contacting flats 34 and 36, for mounting of the first and second fans 20, 22 thereon.

Each pair of heat pipes 40 comprises a heat pipe shorter than the other. Each heat pipe 40 comprises an evaporating section 42 received in a corresponding groove 53 of the base 50, a condensing section 41 extending from and parallel to the evaporating section 42 and a connecting section 43 located between the evaporating section 42 and the condensing section 41. The first and second fans 20, 22 are both axial-flow fans and attached to the first and second contacting flats 34 and 36 of the first fin group 30, respectively. Each of the first and second fans 20, 22 is oriented inclinedly with an acute angle to the base 50. Cooling air produced by the first fan 20 blows into the channels and the base 50 from the left lateral end of the first fin group 30 and then the second fan 22 draws the heated cooling air to leave the heat dissipation device via the right lateral end of the first fin group 30, as clearly shown in FIG. 5.

In assembly, firstly the evaporating sections 42 of the heat pipes 40 are soldered in the grooves 53 of the base 50 and the condensing sections 41 of the heat pipes 40 extend in the through holes 326 to contact with the collars 328 of the fins 32 of the first fin group 30. The first fin group 30 is supported by the condensing sections 41 of the heat pipes 40 and disposed above the base 50 so that a space is provided between the first fin group 30 and the base 50, for installing the fixture securing the dissipation device to the printed circuit board.

Figure 3:
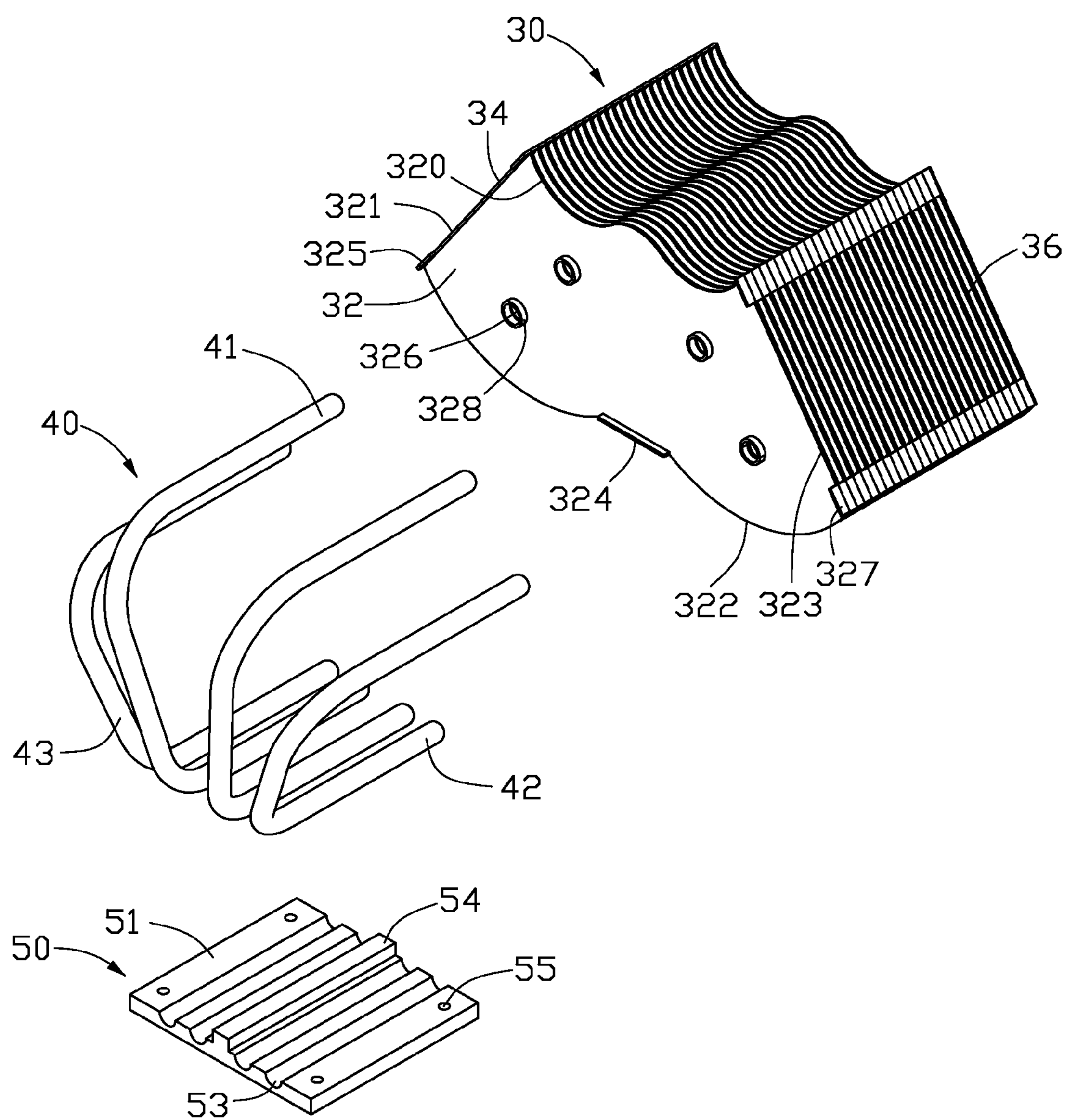
FIG. 3 is an exploded view of FIG. 2, without fans.
Figure 4:
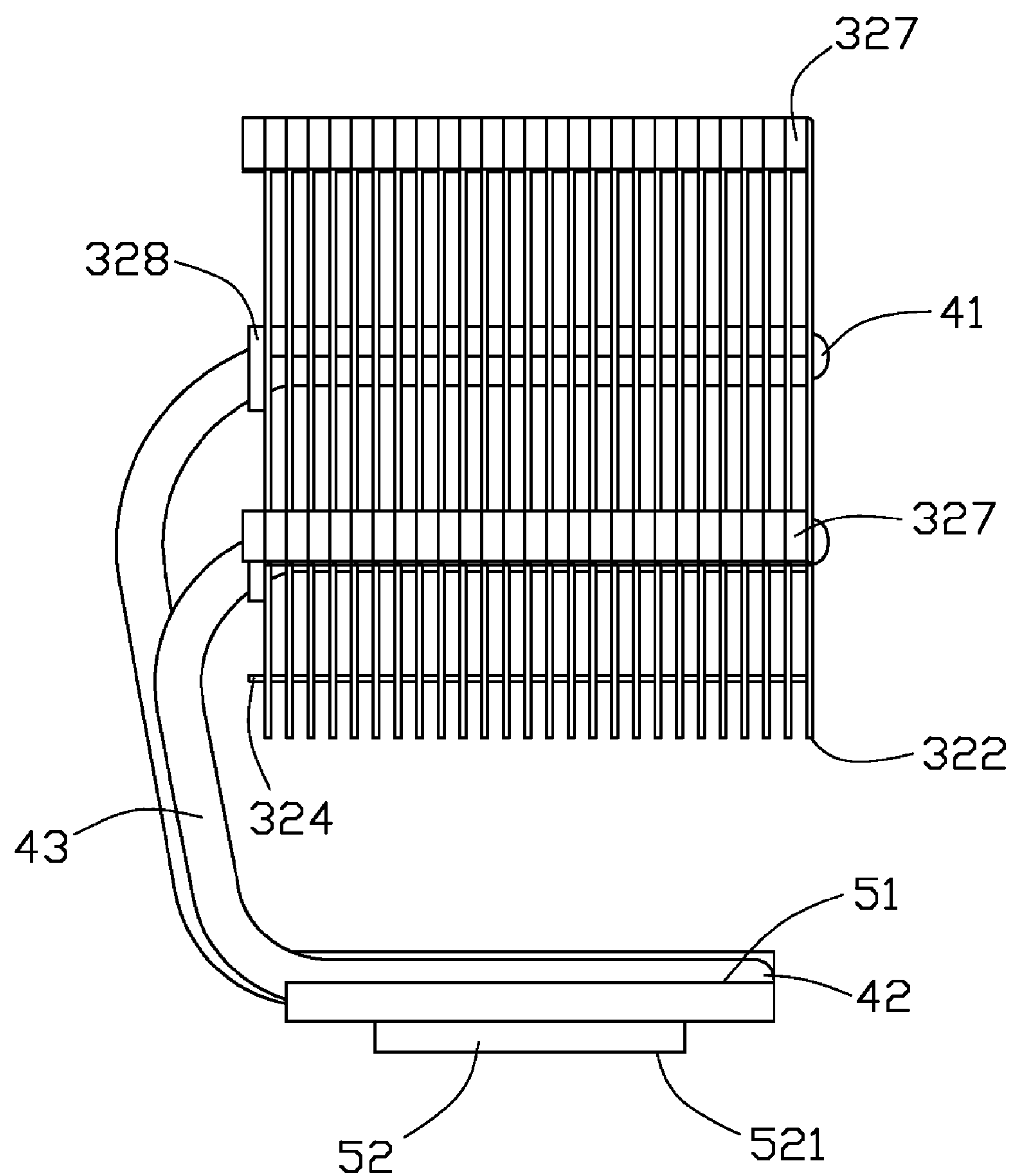
FIG. 4 is an assembled view of FIG. 3, viewed from a lateral side aspect.
Figure 5:
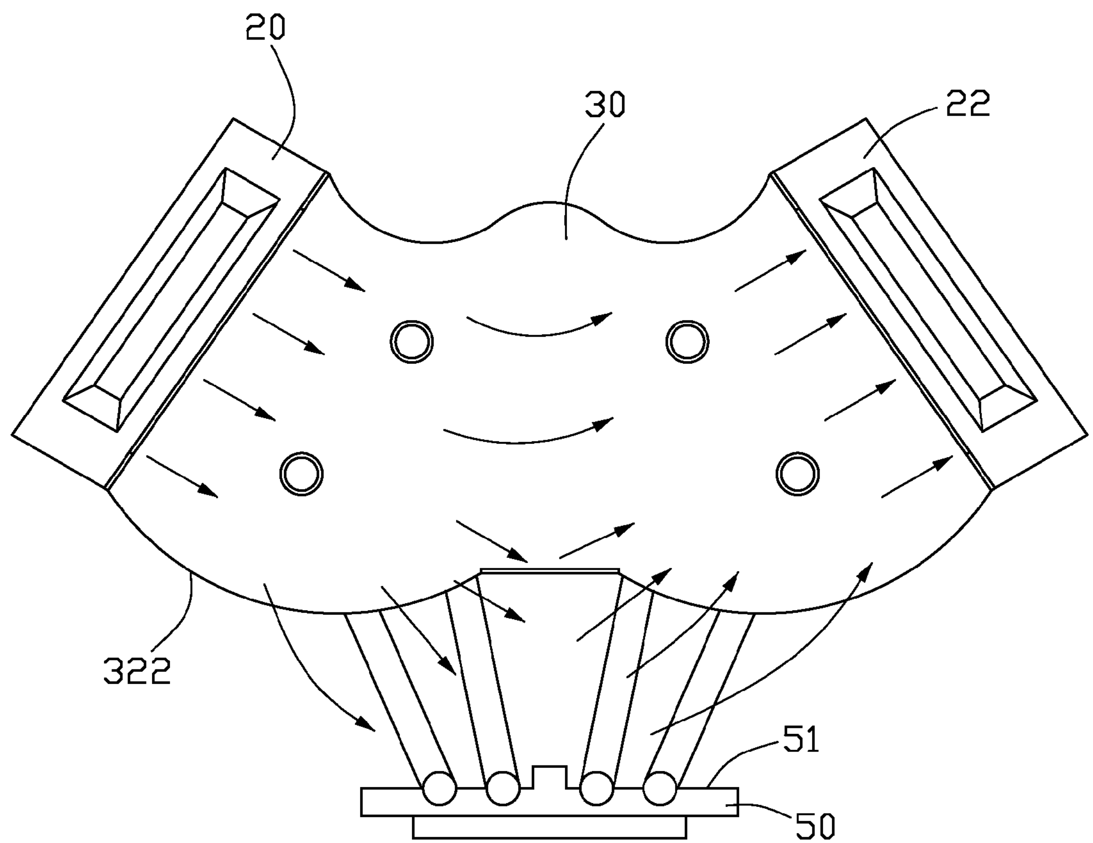
FIG. 5 is a front view of FIG. 2, showing the airflow paths of the heat dissipation device.

Particularly referring to FIGS. 3 and 5, in operation, the evaporating sections 42 of the heat pipes 40 absorb heat of the base 50 and transfer the heat to the fins 32 of the first fin group 30 by the condensing section 41 of the heat pipes 40. The first fan 20 guides the cooling air to blow into the channels from the left lateral end of the first fin group 30. A part of the cooling air blows along the channels and is heated when contacting with the fins 32 of the fin group 30, then the heated cooling air flows away from the right lateral end of the first fin group 30 under the action of the second fan 22. By the provision of the first and second fans 20, 22 being arranged at opposite sides of the first fin group 30 and each being inclined with an acute angle to the base 50, another part of the cooling air is forced to blow downward and toward the center of the top surface 51 of the base 50 to directly dissipate the heat of the base 50. The heat of the base 50 is dissipated not only by the heat pipes 40 but also by the first fan 20 which blows the cooling air to the base 50 and the second fan 22 which draws the heated air from the base 50. Heat dissipation efficiency of the base 50 is greatly enhanced. Moreover, each fin 32 has the second side edge 322 much longer than the first side edge 320 so that the cooling air has a longer airflow path in the lower part of the first fin group 30, in comparison with a common rectangular fin having two opposite sides with equal length. Accordingly, the cooling air can have a more sufficient contact with the lower part of each of the fins 32 which is located near the base 50 and the heat source.

Figure 6:
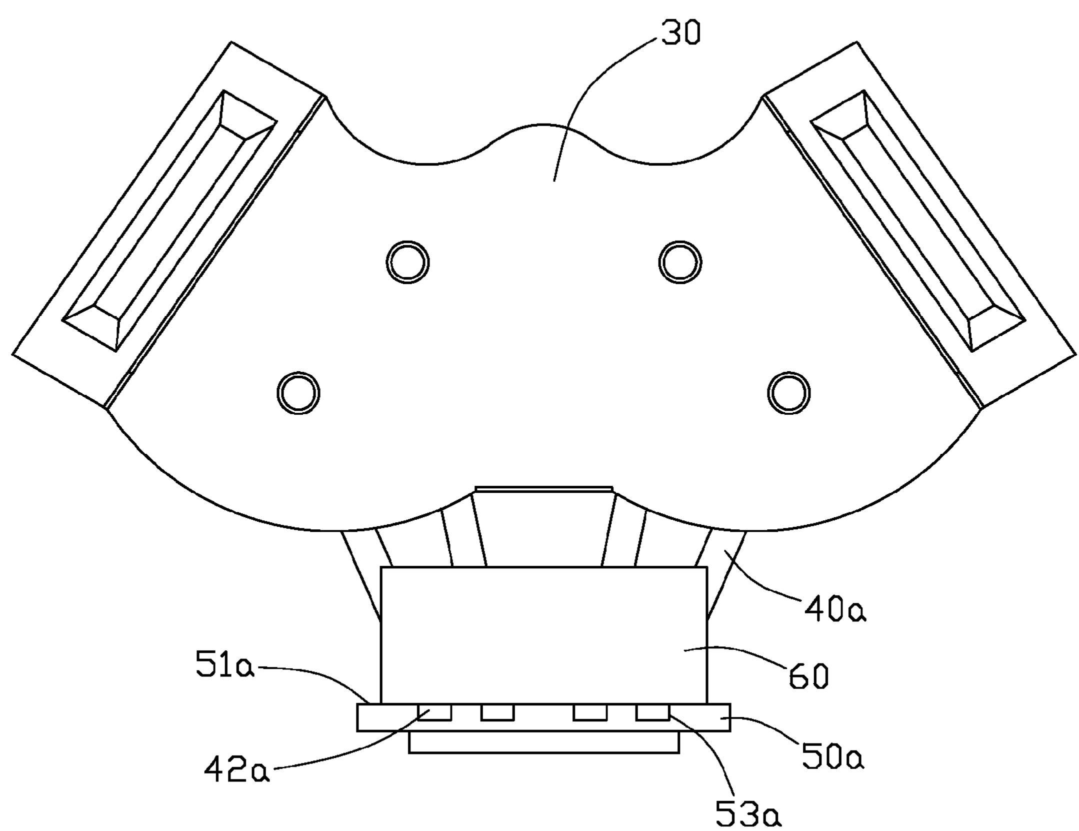
FIG. 6 is a front view of a heat dissipation device in accordance with a second embodiment of the present invention.

FIG. 6 illustrates a front view of a heat dissipation device in accordance with a second embodiment of the present invention. Differences of the heat dissipation device between the second and first embodiments are that the heat dissipation device in the second embodiment comprises a heat pipe 40*a* having a flat evaporating section 42*a* and a base 50*a* having a top surface 51*a* and defining two pairs of parallel grooves 53*a* in two opposite lateral sides thereof. Each groove 53*a* has a rectangular section. A second fin group 60 is located at a top surface 51*a* of the base 50*a* by soldering. Channels (not shown) defined in the second fin group 60 face the ones defined in the first fin group 30 so that a part of the cooling air from the first fan 20 can blow towards the channels of the second fin group 60 via the channels of the first fin group 30. By the arrangement of the second fin group 60, the heat-dissipation area of the heat dissipation device is increased.

Figure 7:
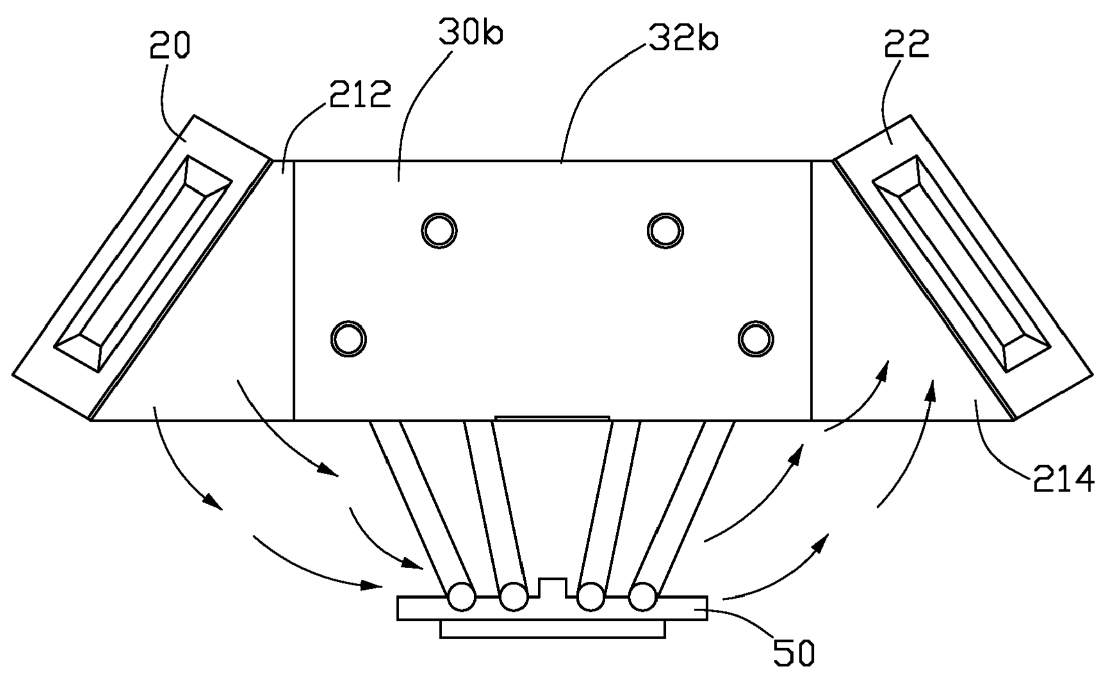
FIG. 7 is a front view of a heat dissipation device in accordance with a third embodiment of the present invention, showing the airflow paths of the heat dissipation device.

FIG. 7 illustrates a front view of a heat dissipation device in accordance with a third embodiment of the present invention. Differences of the heat dissipation device between the third and first embodiments are that the heat dissipation device in the third embodiment comprises a first fin group 30*b* having a plurality of fins 32*b* and first and second fan holders 212, 214 located at opposite lateral sides of the first fin group 30*b*. Each fin 32*b* has a rectangular configuration. Each of the first and second fan holders 212, 214 has a first face (not labeled) attached to a corresponding lateral side of the first fin group 30*b* and a second face (not labeled) having an acute angle with respective to the first face for holding a corresponding one of the first and second fan 20, 22 thereon. The first fan 20 is arranged on the second face of the first fan holder 212 and is oriented with an acute angle to the base 50 so that the cooling air from the first fan 20 can blow towards the base 50. The second fan 22 is arranged on the second face of the second fan holder 214 and is oriented with an acute angle to the base 50 so that the cooling air flowing to and heated by the base 50 is drawn by the second fan 24 away from the base 50.

Figure 8:
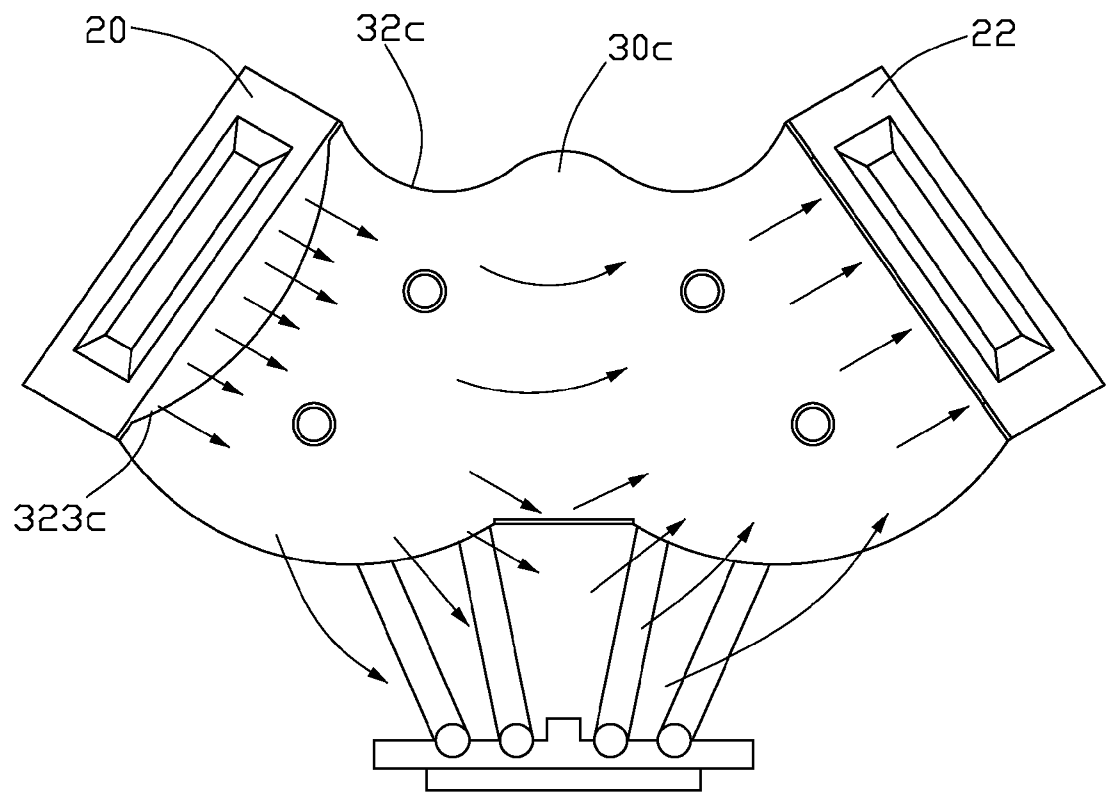
FIG. 8 is a front view of a heat dissipation device in accordance with a fourth embodiment of the present invention, showing the airflow paths of the heat dissipation device.

FIG. 8 illustrates a front view of a heat dissipation device in accordance with a fourth embodiment of the present invention. Differences of the heat dissipation device between the fourth and first embodiments are that the heat dissipation device in the fourth embodiment comprises a first fin group 30*c* having a plurality of fins 32*c*. Each fin 32*c* has a concave first lateral side 323*c* to form an airflow cushion region between the first fan 20 and the first fin group 30*c*, which can reduce noise of the first fan 20 when operating.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat dissipation device comprising:

a heat sink comprising a base and a first fin group located above the base, the first fin group comprising a plurality of fins perpendicular to the base, a plurality of channels being defined between the fins of the first fin group, each of the fins of the first fin group comprising first and second side edges respectively at upper and lower portions of the first fin group, the second side edge having a length longer than that of the first side edge;

two pairs of U-shaped heat pipes connecting the base and the first fin group, each heat pipe comprising an evaporating section received in the base and a condensing section extending in the first fin group, the respective condensing sections of the heat pipes being located at opposite lateral sides of the first fin group;

first and second fans respectively attached to the opposite lateral sides of the first fin group, the first and second fans being arranged inclined to each other and facing the base, each of the first and second fans being oriented with an acute angle to the base; and a second fin group attached to the base and defining a plurality of channels facing the channels of the first fin group;

wherein cooling air produced by the first fan blows towards the first fin group and the base and passes through the first fin group, and the cooling air heated by the first fin group and the base is drawn away from the fin group and the base by an action of the second fan.

2. The heat dissipation device as claimed in claim 1, wherein each pair of the heat pipes has one heat pipe shorter than the other heat pipe, and the condensing sections of each pair of the heat pipes are arranged adjacent to the first and second side edges, respectively.

3. The heat dissipation device as claimed in claim 1, wherein the base defines a plurality of grooves receiving the evaporating sections of the heat pipes therein and the first fin group defines a plurality of through holes accommodating the condensing sections of the heat pipes therein.

4. The heat dissipation device as claimed in claim 1, wherein the base comprises a bulge extending downwardly from a bottom surface thereof and having a lower face adapted for attachment with a heat-generating electronic component.

5. The heat dissipation device as claimed in claim 1, wherein each fin of the first fin group comprises a first flange extending horizontal from a middle portion of the second side edge and located parallel to the base.

6. The heat dissipation device as claimed in claim 5, wherein each fin of the first fin group further comprises second and third flanges extending perpendicularly from the opposite lateral sides of the first fin group and all the second and third flanges form first and second flats, respectively, the first and second fans being attached to the first and second flats, respectively.

7. The heat dissipation device as claimed in claim 1, wherein a first lateral side of the opposite lateral sides of the first fin group on which the first fan is mounted comprises a concave-shaped configuration to form an airflow cushion region between the first fan and the first fin group.

8. A heat dissipation device comprising:

a base having a lower face adapted for attachment with a heat-generating electronic component;

a first fin group arranged above the base, the first fin group comprising a plurality of fins spaced parallel to each other and defining a plurality of channels between the fins, each of the fins of the first fin group comprising first and second side edges respectively at upper and lower portions of the first fin group, the second side edge having a length longer than that of the first side edge, the first side edge having a waved-shaped configuration and having two troughs and a crest between the two troughs, the second side edge having two convex, arc-shaped side edges and a straight side edge recessed between the two arc-shaped side edges; and first and second fans attached to opposite sides of the first fin group;

wherein airflow ports of the first and second fans are oriented towards the base and the first fan produces cooling air to blow towards the first fin group and the base and the second fan draws heated air away from the first fin group and the base.

9. The heat dissipation device as claimed in claim 8, further comprising at least one heat pipe connecting the first fin group and the base.

10. The heat dissipation device as claimed in claim 9, wherein the at least one heat pipe comprises an evaporating section received in a groove of the base and a condensing section extending in the first fin group.

11. The heat dissipation device as claimed in claim 8, wherein each fin comprises a first flange extending horizontal from the straight side edge of a middle portion of the second side edge and located parallel to the base.

12. The heat dissipation device as claimed in claim 11, wherein each fin further comprises second and third flanges extending perpendicularly from the opposite lateral sides of the first fin group and all the second and third flanges form first and second flats, respectively, the first and second fans being attached to the first and second flats, respectively.

13. The heat dissipation device as claimed in claim 8, wherein the first and second fans are arranged inclined to each other and oriented facing towards the base.

14. The heat dissipation device as claimed in claim 8 further comprising a second fin group attached to the base and defining a plurality of channels facing channels defined in the first fin group.

15. The heat dissipation device as claimed in claim 14, wherein the second fin group is sandwiched between the base and the first fin group, fixed on the base, and spaced from the second side edge of the first fin group.

16. The heat dissipation device as claimed in claim 8, wherein one of the two opposite sides of the first fin group on which the first fan is mounted comprises a concave-shaped configuration to form an airflow cushion region between the first fan and the first fin group.

* * * * *